(12) United States Patent
Liu et al.

(10) Patent No.: US 10,903,846 B1
(45) Date of Patent: Jan. 26, 2021

(54) POWER EFFICIENT SUCCESSIVE APPROXIMATION ANALOG TO DIGITAL CONVERTER

(71) Applicant: Avago Technologies International Sales Pte. Limited, Singapore (SG)

(72) Inventors: Yong Liu, Irvine, CA (US); Delong Cui, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/867,358

(22) Filed: May 5, 2020

(51) Int. Cl.
| | |
|---|---|
| *H03M 1/12* | (2006.01) |
| *H03M 1/46* | (2006.01) |
| *H03M 1/66* | (2006.01) |
| *H03M 1/00* | (2006.01) |
| *H03M 1/10* | (2006.01) |
| *H03M 1/06* | (2006.01) |

(52) U.S. Cl.
CPC .............. *H03M 1/462* (2013.01); *H03M 1/66* (2013.01); *H03M 1/00* (2013.01); *H03M 1/001* (2013.01); *H03M 1/06* (2013.01); *H03M 1/10* (2013.01); *H03M 1/12* (2013.01); *H03M 1/1245* (2013.01)

(58) Field of Classification Search
CPC .......... H03M 1/00; H03M 1/12; H03M 1/001; H03M 1/06; H03M 1/10; H03M 1/1245
USPC ................. 341/156, 155, 118, 120, 122, 126
See application file for complete search history.

(56) References Cited

U.S. PATENT DOCUMENTS

2013/0051501 A1* 2/2013 Furuta ................. H03M 1/0697
375/340

OTHER PUBLICATIONS

Tomohiko Ogawa, et al, "Non-binary SAR ADC with Digital Error Correction for Low Power Applications," 2010 IEEE Asia Pacific Conference on Circuits and Systems, pp. 196-199, Dec. 2010.
Vito Giannini, "An 820uW 9b 40MS/s Noise-Tolerant Dynamic-SAR ADC in 90nm Digital CMOS," IEEE Solid-State Circuits Conference, pp. 237-238, 2008.

* cited by examiner

*Primary Examiner* — Joseph J Lauture
(74) *Attorney, Agent, or Firm* — Foley & Lardner LLP

(57) ABSTRACT

Disclosed herein are related to systems and methods for a power efficient successive approximation analog to digital converter (SAR ADC). In one aspect, the SAR ADC includes a sample and digital to analog conversion (DAC) circuit to sample an input voltage. In one aspect, the SAR ADC includes a first comparator coupled to the DAC circuit, and a first set of storage circuits coupled between the first comparator and the DAC circuit. In one aspect, the SAR ADC includes a second comparator coupled to the DAC circuit, and a second set of storage circuits coupled between the second comparator and the DAC circuit. In one aspect, the SAR ADC includes a control circuit configured to select, for each of multiple bits corresponding to the input voltage, a corresponding comparator to determine a state of the each of the multiple bits during a corresponding time period.

20 Claims, 7 Drawing Sheets

US 10,903,846 B1

POWER EFFICIENT SUCCESSIVE APPROXIMATION ANALOG TO DIGITAL CONVERTER

FIELD OF THE DISCLOSURE

This disclosure generally relates to a communication system, including but not limited to a power efficient successive approximation analog to digital converter (SAR ADC).

BACKGROUND OF THE DISCLOSURE

Recent developments in communication and computing devices demand high data rates. For example, network switches, routers, hubs or any communication devices may exchange data at a high speed (e.g., 1 Mbps to 100 Gbps) to stream data in real time or process a large amount of data in a seamless manner. To improve bandwidth efficiency, an amplitude or a voltage of a signal may represent multiple bits, and the signal may be exchanged between two or more communication devices through a cable or a wireless medium. For example, 1.2 V of a signal may represent [00010110], and 1.3 V of the signal may represent [00011001]. To convert a voltage of an input signal into corresponding bits, some communication devices implement a SAR ADC. For example, the SAR ADC may determine a plurality of bits corresponding to the input signal through successive approximation.

SUMMARY

Various embodiments disclosed herein are related to a device for communication of data. In some embodiments, the device includes a sample and digital to analog conversion (DAC) circuit to sample an input voltage to obtain a first sampled voltage. In some embodiments, the device includes a first comparator coupled to the sample and DAC circuit. In some embodiments, the device includes a first set of storage circuits coupled to the first comparator and the sample and DAC circuit. In some embodiments, the first set of storage circuits is configured to store states of a first subset of a plurality of bits corresponding to an input voltage. In some embodiments, the device includes a second comparator coupled to the sample and DAC circuit. In some embodiments, the device includes a second set of storage circuits coupled to the second comparator and the sample and DAC circuit. In some embodiments, the second set of storage circuits is configured to store states of a second subset of the plurality of bits corresponding to the input voltage. In some embodiments, the device includes a control circuit coupled to the first comparator and the second comparator. The control circuit may be configured to select, during a first time period for a target bit of the plurality of bits corresponding to the input voltage, the first comparator to determine a state of the target bit. The first comparator may determine the state of the target bit according to the first sampled voltage.

In some embodiments, the first comparator has a faster detection speed than the second comparator, where the second comparator has a higher sensitivity than the first comparator.

In some embodiments, a corresponding one of the first set of storage circuits is configured to store the determined state of the target bit.

In some embodiments, the control circuit is configured to select, during a second time period for another target bit of the plurality of bits, and the second comparator is configured to determine a state of the another target bit. In some embodiments, the control circuit is configured to select the first comparator during the first time period and to select the second comparator during the second time period, according to a predetermined sequence. In some embodiments, the sample and DAC circuit is configured to sample the input voltage to obtain a second sampled voltage, based at least in part on the state of the target bit. In some embodiments, the second comparator is configured to determine a state of the another target bit according to the second sampled voltage. In some embodiments, a corresponding one of the second set of storage circuits is configured to store the determined state of the another target bit.

In some embodiments, the control circuit is configured to select, for the target bit, the first comparator, in response to the target bit being one of the first subset of the plurality of bits.

In some embodiments, an output of the first comparator is directly coupled to input ports of the first set of storage circuits, where an output of the second comparator is directly coupled to input ports of the second set of storage circuits.

Various embodiments disclosed herein are related to an apparatus for communication of data. In some embodiments, the apparatus includes a receiver. In some embodiments, the receiver includes a sample and digital to analog conversion (DAC) circuit to sample an input voltage. In some embodiments, the receiver includes a first comparator coupled to the sample and DAC circuit. In some embodiments, the receiver includes a first set of storage circuits coupled between the first comparator and the sample and DAC circuit. In some embodiments, the receiver includes a second comparator coupled to the sample and DAC circuit. In some embodiments, the receiver includes a second set of storage circuits coupled between the second comparator and the sample and DAC circuit. In some embodiments, the receiver includes a control circuit configured to select, for each of a plurality of bits corresponding to the input voltage, a corresponding comparator from the first comparator and the second comparator to determine a state of the each of the plurality of bits during a corresponding time period. In some embodiments, the apparatus includes a processor coupled to the receiver. In some embodiments, the processor is configured to receive states of the plurality of bits from the first set of storage circuits and the second set of storage circuits and perform logic computations according to the received states of the plurality of bits.

In some embodiments, the first comparator has a faster detection speed than the second comparator, where the second comparator has a higher sensitivity than the first comparator.

In some embodiments, the control circuit is configured to select, for a first subset of the plurality of bits, the first comparator, and select, for a second subset of the plurality of bits, the second comparator.

In some embodiments, the sample and DAC circuit is configured to sample, for a first bit of the plurality of bits, the input voltage to obtain a first sampled voltage. In some embodiments, the first comparator is configured to determine a state of the first bit of the plurality of bits according to the first sampled voltage. In some embodiments, a corresponding one of the first set of storage circuits is configured to store the determined state of the first bit of the plurality of bits. In some embodiments, based at least in part on the determined state of the first bit of the plurality of bits from the corresponding one of the first set of storage circuits, the sample and DAC circuit is configured to sample, for a second bit of the plurality of bits, the input voltage to obtain a second sampled voltage. In some embodiments, the second comparator is configured to determine a state of the second bit of the plurality of bits according to the second sampled voltage.

In some embodiments, an output of the first comparator is directly coupled to input ports of the first set of storage circuits, where an output of the second comparator is directly coupled to input ports of the second set of storage circuits.

Various embodiments disclosed herein are related to a method for communication of data. In some embodiments, the method includes sampling, by a sample and digital to analog conversion (DAC) circuit, an input voltage to obtain a first sampled voltage. In some embodiments, the method includes determining, by a first comparator coupled to a first set of storage circuits, a state of a first bit of a plurality of bits corresponding to the input voltage, according to the first sampled voltage. In some embodiments, the method includes sampling, by the sample and DAC circuit, the input voltage to obtain a second sampled voltage. In some embodiments, the method includes determining, by a second comparator coupled to a second set of storage circuits different from the first set of storage circuits, a state of a second bit of the plurality of bits, according to the second sampled voltage.

In some embodiments, the first comparator has a faster detection speed than the second comparator, where the second comparator has a higher sensitivity than the first comparator.

In some embodiments, the method includes storing, by a corresponding one of the first set of storage circuits, the determined state of the first bit, and storing, by a corresponding one of the second set of storage circuits, the determined state of the second bit. In some embodiments, sampling, by the sample and DAC circuit, the input voltage to obtain the second sampled voltage is based at least in part on the determined state of the first bit stored by the corresponding one of the first set of storage circuits.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

The details of various embodiments of the methods and systems are set forth in the accompanying drawings and the description below.

DETAILED DESCRIPTION

For purposes of reading the description of the various embodiments below, the following descriptions of the sections of the specification and their respective contents can be helpful:

Section A describes a network environment and computing environment which can be useful for practicing embodiments described herein; and Section B describes embodiments of systems and methods for power efficient SAR ADC, according to one or more embodiments.

A. Computing and Network Environment

Figure 1A:
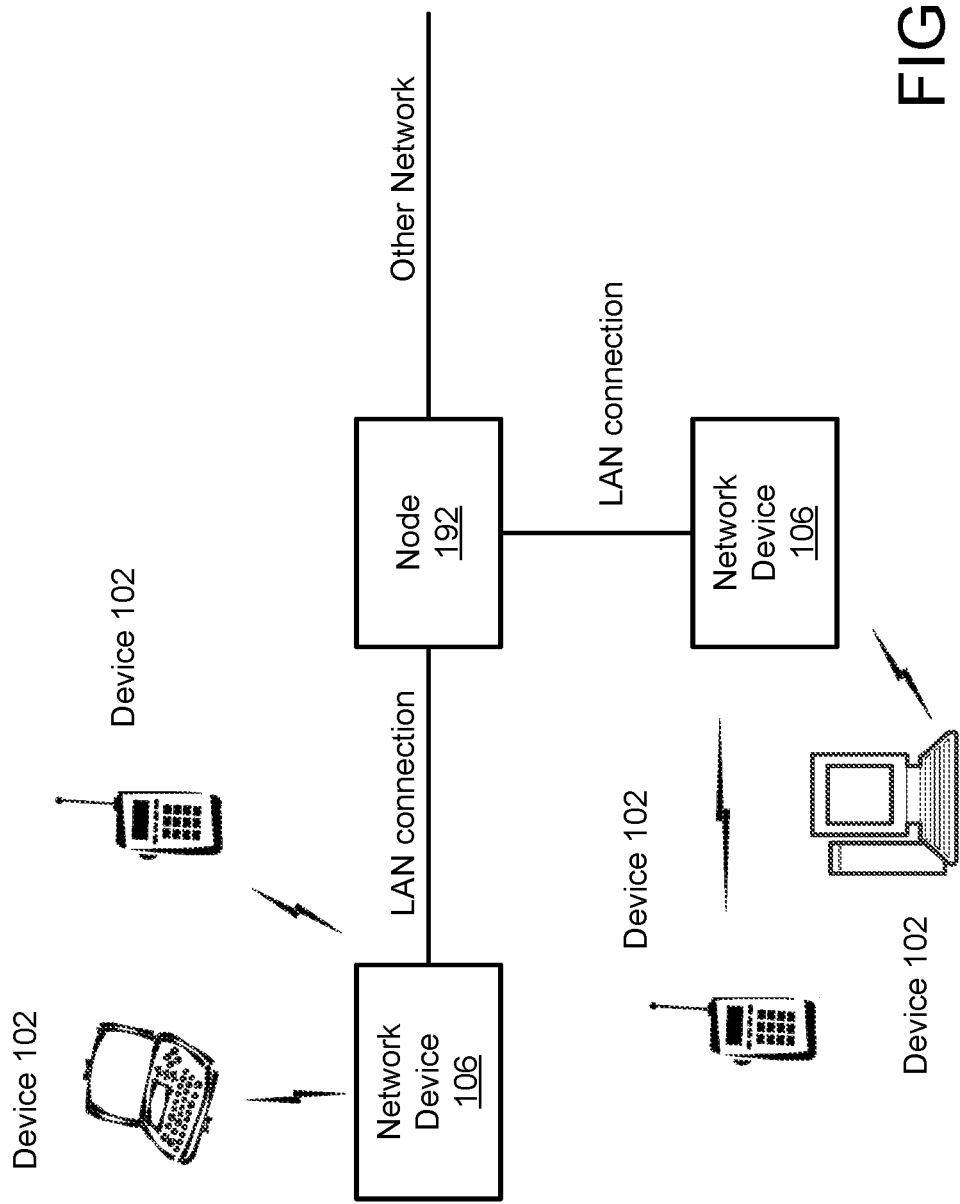
FIG. 1A is a block diagram depicting a network environment including one or more access points in communication with one or more devices or stations, according to one or more embodiments.

Prior to discussing specific embodiments of the present solution, it can be helpful to describe aspects of the operating environment as well as associated system components (e.g., hardware elements) in connection with the methods and systems described herein. Referring to FIG. 1A, an embodiment of a network environment is depicted. In brief overview, the network environment includes a wireless communication system that includes one or more access points (APs) 106, one or more wireless communication devices 102 and a network hardware component 192. The wireless communication devices 102 can for example include laptop computers 102, tablets 102, personal computers 102 and/or cellular telephone devices 102. The details of an embodiment of each wireless communication device 102 and/or AP 106 are described in greater detail with reference to FIGS. 1B and 1C. The network environment can be an ad hoc network environment, an infrastructure wireless network environment, a subnet environment, etc. in one embodiment. The APs 106 can be operably coupled to the network hardware 192 via local area network connections. The network hardware 192, which can include a router, gateway, switch, bridge, modem, system controller, appliance, etc., can provide a local area network connection for the communication system. Each of the APs 106 can have an associated antenna or an antenna array to communicate with the wireless communication devices in its area. The wireless communication devices 102 can register with a particular AP 106 to receive services from the communication system (e.g., via a SU-MIMO or MU-MIMO configuration). For direct connections (e.g., point-to-point communications), some wireless communication devices can communicate directly via an allocated channel and communications protocol. Some of the wireless communication devices 102 can be mobile or relatively static with respect to AP 106.

In some embodiments an AP 106 includes a device or module (including a combination of hardware and software) that allows wireless communication devices 102 to connect to a wired network using wireless-fidelity (WiFi), or other standards. An AP 106 can sometimes be referred to as an wireless access point (WAP). An AP 106 can be implemented (e.g., configured, designed and/or built) for operating in a wireless local area network (WLAN). An AP 106 can connect to a router (e.g., via a wired network) as a standalone device in some embodiments. In other embodiments, an AP 106 can be a component of a router. An AP 106 can provide multiple devices access to a network. An AP 106 can, for example, connect to a wired Ethernet connection and provide wireless connections using radio frequency links for other devices 102 to utilize that wired connection. An AP 106 can be implemented to support a standard for sending and receiving data using one or more radio frequencies. Those standards, and the frequencies they use can be defined by the IEEE (e.g., IEEE 802.11 standards). An AP 106 can be configured and/or used to support public Internet hotspots, and/or on a network to extend the network's Wi-Fi signal range.

In some embodiments, the access points 106 can be used for (e.g., in-home or in-building) wireless networks (e.g., IEEE 802.11, Bluetooth, ZigBee, any other type of radio frequency based network protocol and/or variations thereof). Each of the wireless communication devices 102 can include a built-in radio and/or is coupled to a radio. Such wireless communication devices 102 and/or access points 106 can operate in accordance with the various aspects of the disclosure as presented herein to enhance performance, reduce costs and/or size, and/or enhance broadband applications. Each wireless communication device 102 can have the capacity to function as a client node seeking access to resources (e.g., data, and connection to networked nodes such as servers) via one or more access points 106.

The network connections can include any type and/or form of network and can include any of the following: a point-to-point network, a broadcast network, a telecommunications network, a data communication network, a computer network. The topology of the network can be a bus, star, or ring network topology. The network can be of any such network topology as known to those ordinarily skilled in the art capable of supporting the operations described herein. In some embodiments, different types of data can be transmitted via different protocols. In other embodiments, the same types of data can be transmitted via different protocols.

Figure 1B:
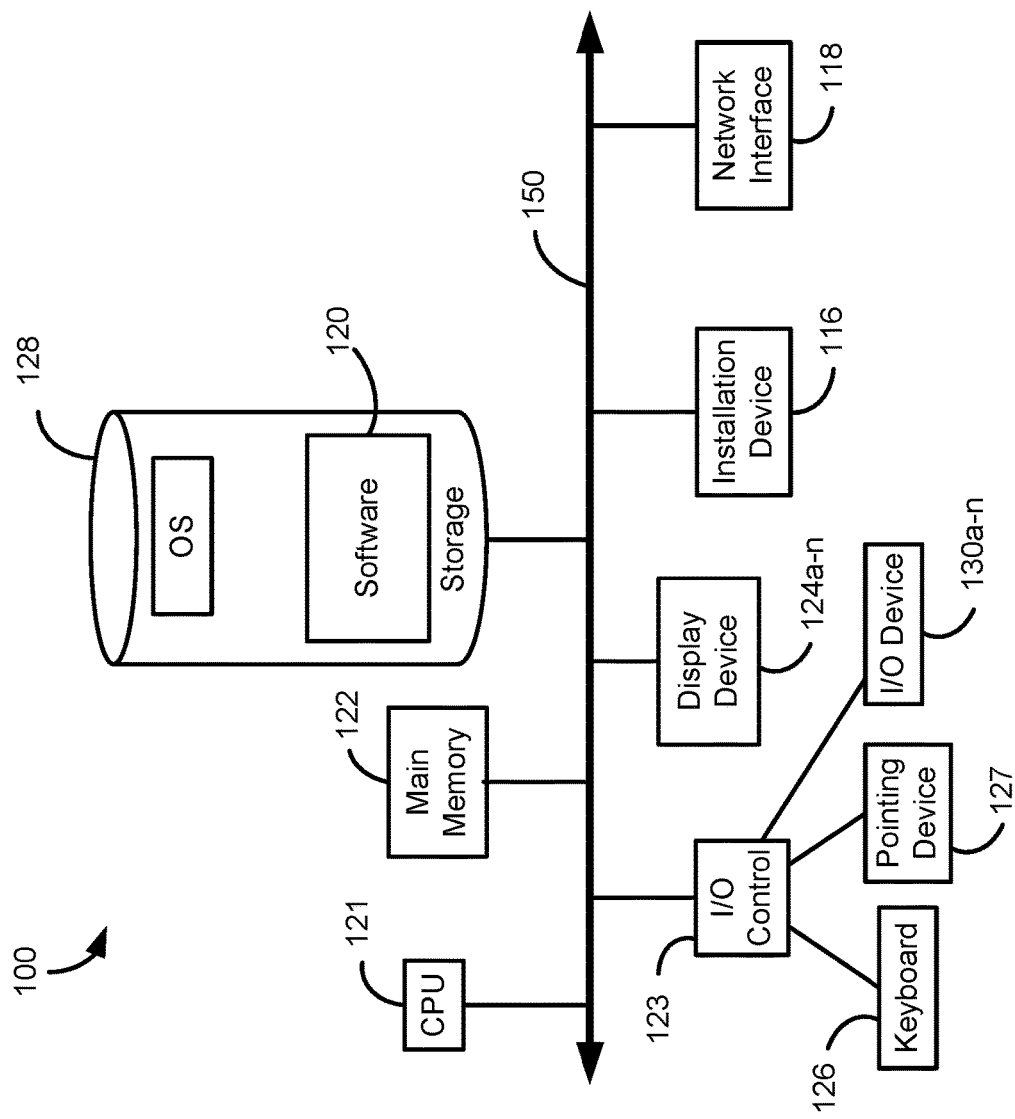
FIGS. 1B and 1C are block diagrams depicting computing devices useful in connection with the methods and systems described herein, according to one or more embodiments.
Figure 1C:
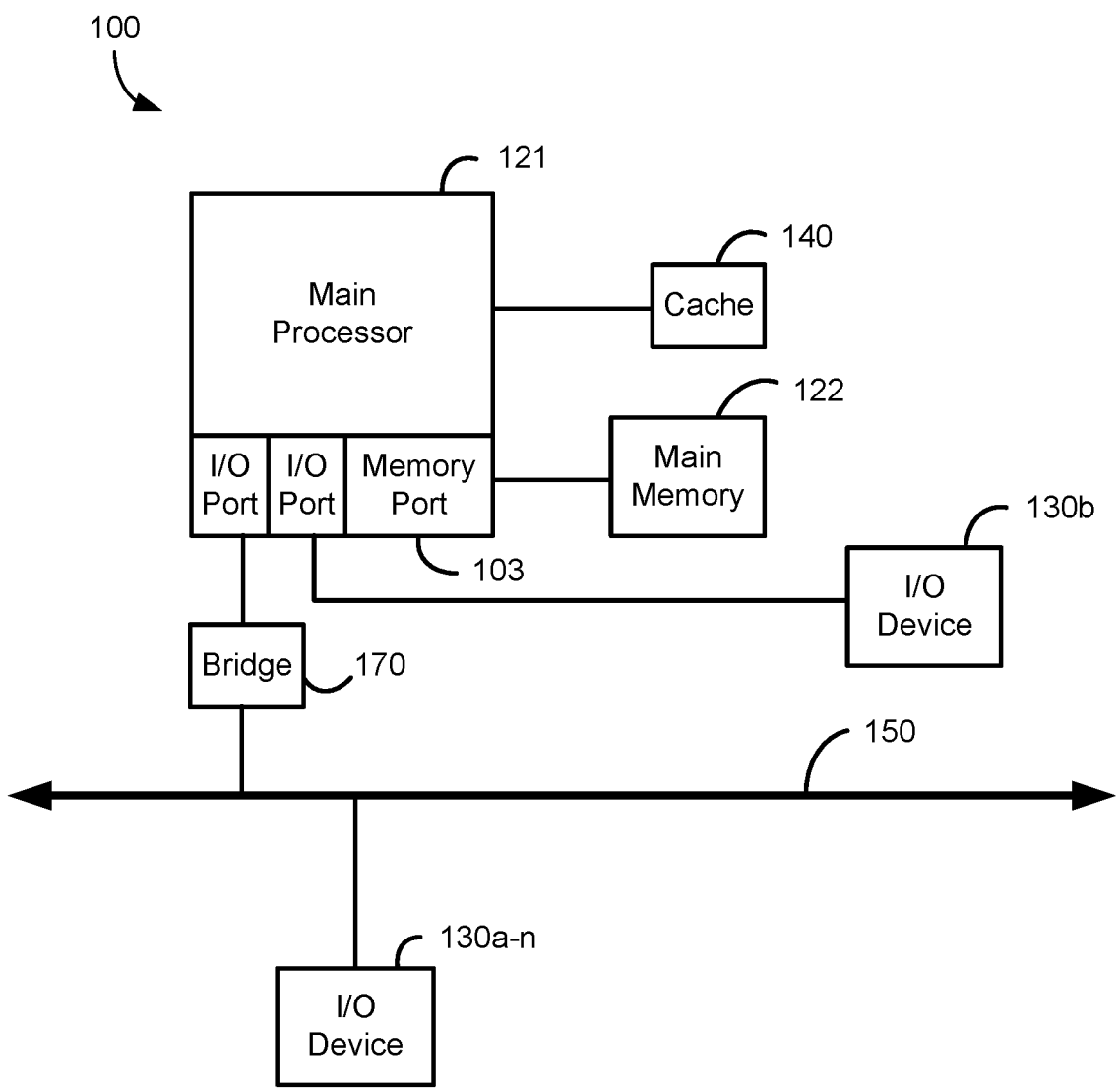

The communications device(s) 102 and access point(s) 106 can be deployed as and/or executed on any type and form of computing device, such as a computer, network device or appliance capable of communicating on any type and form of network and performing the operations described herein. FIGS. 1B and 1C depict block diagrams of a computing device 100 useful for practicing an embodiment of the wireless communication devices 102 or AP 106. As shown in FIGS. 1B and 1C, each computing device 100 includes a central processing unit 121, and a main memory unit 122. As shown in FIG. 1B, a computing device 100 can include a storage device 128, an installation device 116, a network interface 118, an I/O controller 123, display devices 124a-124n, a keyboard 126 and a pointing device 127, such as a mouse. The storage device 128 can include an operating system and/or software. As shown in FIG. 1C, each computing device 100 can also include additional optional elements, such as a memory port 103, a bridge 170, one or more input/output devices 130a-130n, and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, such as: those manufactured by Intel Corporation of Santa Clara, Calif.; those manufactured by International Business Machines of White Plains, N.Y.; or those manufactured by Advanced Micro Devices of Sunnyvale, Calif. The computing device 100 can be based on any of these processors, or any other processor capable of operating as described herein.

Main memory unit 122 can be one or more memory chips capable of storing data and allowing any storage location to be directly accessed by the microprocessor 121, such as any type or variant of Static random access memory (SRAM), Dynamic random access memory (DRAM), Ferroelectric RAM (FRAM), NAND Flash, NOR Flash and Solid State Drives (SSD). The main memory 122 can be based on any of the above described memory chips, or any other available memory chips capable of operating as described herein. In the embodiment shown in FIG. 1B, the processor 121 communicates with main memory 122 via a system bus 150 (described in more detail below). FIG. 1C depicts an embodiment of a computing device 100 in which the processor communicates directly with main memory 122 via a memory port 103. For example, in FIG. 1C the main memory 122 can be DRDRAM.

FIG. 1C depicts an embodiment in which the main processor 121 communicates directly with cache memory 140 via a secondary bus, sometimes referred to as a backside bus. In other embodiments, the main processor 121 communicates with cache memory 140 using the system bus 150. Cache memory 140 typically has a faster response time than main memory 122 and is provided by, for example, SRAM, BSRAM, or EDRAM. In the embodiment shown in FIG. 1C, the processor 121 communicates with various I/O devices 130 via a local system bus 150. Various buses can be used to connect the central processing unit 121 to any of the I/O devices 130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the processor 121 can use an Advanced Graphics Port (AGP) to communicate with the display 124. FIG. 1C depicts an embodiment of a computer 100 in which the main processor 121 can communicate directly with I/O device 130b, for example via HYPERTRANSPORT, RAPIDIO, or INFINIBAND communications technology. FIG. 1C also depicts an embodiment in which local busses and direct communication are mixed: the processor 121 communicates with I/O device 130a using a local interconnect bus while communicating with I/O device 130b directly.

A wide variety of I/O devices 130a-130n can be present in the computing device 100. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices can be controlled by an I/O controller 123 as shown in FIG. 1B. The I/O controller can control one or more I/O devices such as a keyboard 126 and a pointing device 127, e.g., a mouse or optical pen. Furthermore, an I/O device can also provide storage and/or an installation medium 116 for the computing device 100. In still other embodiments, the computing device 100 can provide USB connections (not shown) to receive handheld USB storage devices such as the USB Flash Drive line of devices manufactured by Twintech Industry, Inc. of Los Alamitos, Calif.

Referring again to FIG. 1B, the computing device 100 can support any suitable installation device 116, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 100 can further include a storage device, such as one or more hard disk drives or redundant arrays of independent disks, for storing an operating system and other related software, and for storing application software programs such as any program or software 120 for implementing (e.g., configured and/or designed for) the systems and methods described herein. Optionally, any of the installation devices 116 could also be used as the storage device. Additionally, the operating system and the software can be run from a bootable medium.

Furthermore, the computing device 100 can include a network interface 118 to interface to the network 104 through a variety of connections including, but not limited to, standard telephone lines, LAN or WAN links (e.g., 802.11, T1, T3, 56kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 100 communicates with other computing devices 100' via any type and/or form of gateway or tunneling protocol such as Secure Socket Layer (SSL) or Transport Layer Security (TLS). The network interface 118 can include a built-in network adapter, network interface card, PCMCIA network card, card bus network adapter, wireless network adapter, USB network adapter, modem or any other device suitable for interfacing the computing device 100 to any type of network capable of communication and performing the operations described herein.

In some embodiments, the computing device 100 can include or be connected to one or more display devices 124a-124n. As such, any of the I/O devices 130a-130n and/or the I/O controller 123 can include any type and/or form of suitable hardware, software, or combination of hardware and software to support, enable or provide for the connection and use of the display device(s) 124a-124n by the computing device 100. For example, the computing device 100 can include any type and/or form of video adapter, video card, driver, and/or library to interface, communicate, connect or otherwise use the display device(s) 124a-124n. In one embodiment, a video adapter can include multiple connectors to interface to the display device(s) 124a-124n. In other embodiments, the computing device 100 can include multiple video adapters, with each video adapter connected to the display device(s) 124a-124n. In some embodiments, any portion of the operating system of the computing device 100 can be configured for using multiple displays 124a-124n. In further embodiments, an I/O device 130 can be a bridge between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 100 of the sort depicted in FIGS. 1B and 1C can operate under the control of an operating system, which control scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7, 8 and 10, produced by Microsoft Corporation of Redmond, Wash.; MAC OS, produced by Apple Computer of Cupertino, Calif.; WebOS, produced by Research In Motion (RIM); OS/2, produced by International Business Machines of Armonk, N.Y.; and Linux, a freely-available operating system distributed by Caldera Corp. of Salt Lake City, Utah, or any type and/or form of a Unix operating system, among others.

The computer system 100 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. In some embodiments, the computing device 100 can have different processors, operating systems, and input devices consistent with the device. For example, in one embodiment, the computing device 100 is a smart phone, mobile device, tablet or personal digital assistant. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Aspects of the operating environments and components described above will become apparent in the context of the systems and methods disclosed herein.

B. Power Efficient SAR ADC

Various embodiments disclosed herein are related to a power efficient SAR ADC. In some embodiments, the SAR ADC includes a digital to analog conversion (DAC) circuit to sample an input voltage. In some embodiments, the SAR ADC includes a first comparator coupled to the DAC circuit, and a first set of storage circuits coupled between the first comparator and the DAC circuit. In some embodiments, the SAR ADC includes a second comparator coupled to the DAC circuit, and a second set of storage circuits coupled between the second comparator and the DAC circuit. In one aspect, the SAR ADC includes a control circuit configured to select, for each of a plurality of bits corresponding to the input voltage, a corresponding comparator from the first comparator and the second comparator to determine a state of the each of the plurality of bits during a corresponding time period.

Advantageously, the disclosed SAR ADC can achieve speed and power efficiencies. In one aspect, the first comparator has a faster detection speed than the second comparator, where the second comparator has a higher sensitivity than the first comparator. Hence, selectively configuring the first comparator and the second comparator allows determining states of different bits of an input voltage to be performed in an efficient manner. For example, a state of a most significant bit (MSB) can be determined by the first comparator in a prompt manner, where a state of a least significant bit (LSB) can be determined by the second comparator with a high sensitivity. In one configuration, output ports of the first comparator and the second comparator are coupled to storage circuits, such that first comparator and the second comparator can store the determined states of bits by the storage circuits. However, a large number of storage circuits (e.g., more than 7) coupled to the first comparator and the second comparator may contribute to a large amount of capacitive load, which may degrade the power efficiency and/or the operation speed of the first comparator and the second comparator. By implementing the first comparator coupled to the first set of storage circuits, and the second comparator coupled to the second set of storage circuits, capacitive loads at output ports of the first comparator and the second comparator can be reduced. Due to the reduced capacitive loads, the first comparator and the second comparator may operate in a prompt and power efficient manner.

Figure 2:
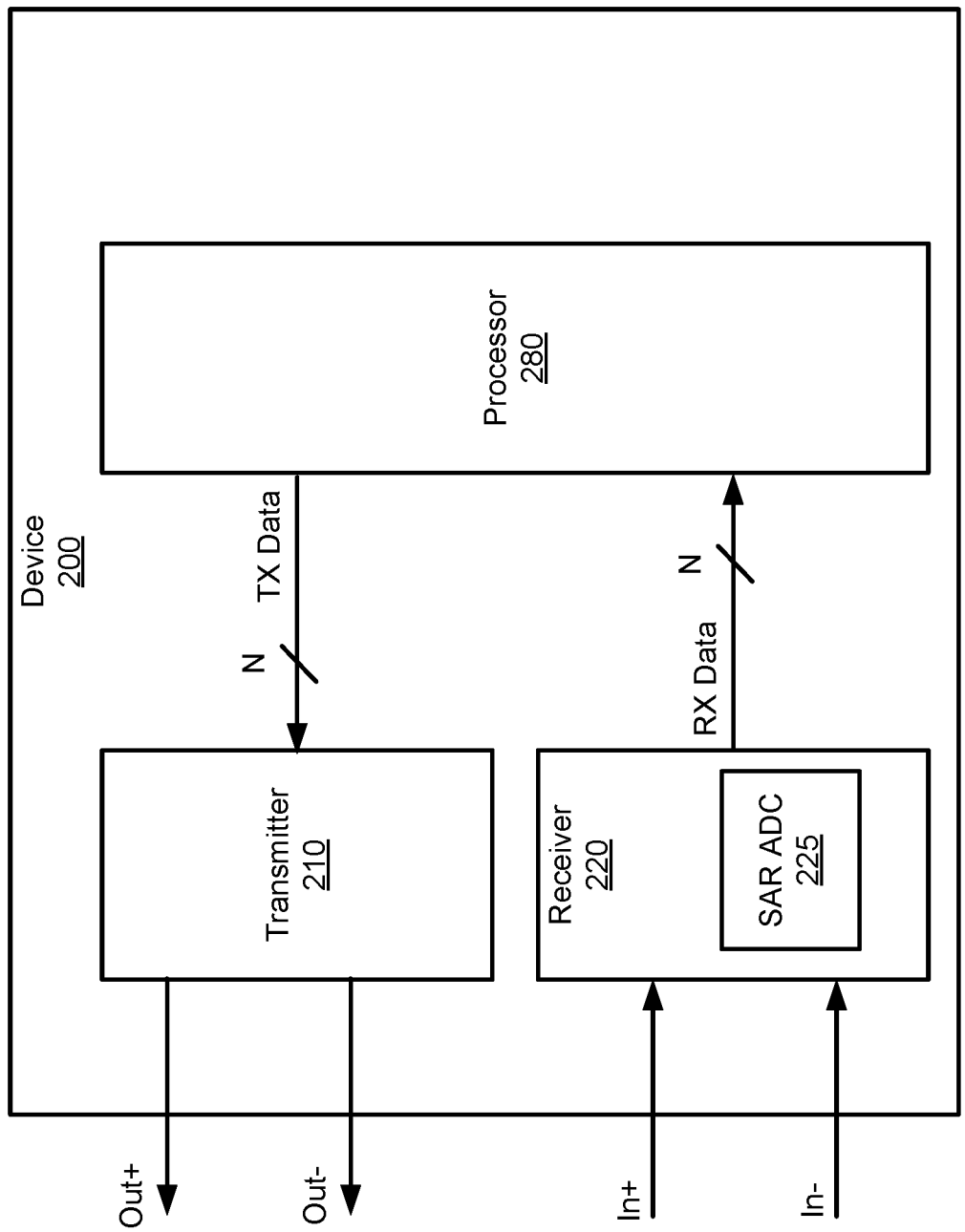
FIG. 2 is a block diagram depicting a communication device, according to one or more embodiments.

FIG. 2 is a block diagram depicting a communication device 200, according to one or more embodiments. In some embodiments, the communication device 200 is a system, a device, or an apparatus for a network communication. For example, the communication device 200 is implemented as part of the network device 106, the node 192, or the device 102. In some embodiments, the device 200 includes a transmitter 210, a receiver 220, and a processor 280. These components may operate together to communicate with another communication device through a network cable (e.g., Ethernet, USB, Firewire, etc.) and/or through a wireless medium (e.g., Wi-Fi, Bluetooth, 60 GHz link, cellular network, etc.). In some embodiments, the communication device 200 includes more, fewer, or different components than shown in FIG. 2.

The transmitter 210 is a circuit or a component that receives transmit data TX Data from the processor 280, and generates output signals Out+, Out−. The transmitter 210 may receive N bits of digital data TX Data from the processor 280, and generate the output signals Out+, Out− having voltages or currents corresponding to the digital data TX Data. The output signals Out+, Out− may be differential signals. In some embodiments, the transmitter 210 may generate a single ended signal or a signal in a different representation for the output signals Out+, Out−. In some embodiments, the transmitter 210 transmits the output signals Out+, Out− through a network cable. In some embodiments, the transmitter 210 provides the output signals Out+, Out− to a wireless transmitter (not shown) that can upconvert the output signals Out+, Out− to generate a wireless transmit signal at a radio frequency and transmit the wireless transmit signal through a wireless medium.

The receiver 220 is a circuit or a component that receives input signals In+, In−, and generates receive data RX Data. In some embodiments, the receiver 220 receives the input signals In+, In− through a network cable. The input signals In+, In− may be differential signals. In some embodiments, the receiver 220 may receive a single ended signal or a signal in a different representation for the input signals In+, In−. In some embodiments, the receiver 220 receives the input signals In+, In− from a wireless receiver (not shown) that can receive a wireless receive signal through a wireless medium and downconvert the wireless receive signal to generate the input signals In+, In− at a baseband frequency. In some embodiments, the receiver 220 receives the input signals In+, In− and generates N bits of digital data RX Data corresponding to voltages or currents of the input signals In+, In−. The receiver 220 may provide the digital data RX Data to the processor 280. In some embodiments, the receiver 220 includes a SAR ADC 225 that can convert the input signals In+, In− into N-bit digital data RX Data in a power efficient manner. Detailed description on implementations and operations of the SAR ADC 225 are provided below with respect to FIGS. 3 through 5.

The processor 280 is a circuit or a component that can perform logic computations. In some embodiments, the processor 280 is implemented as a field-programmable gate array, an application-specific integrated circuit, or state machine. The processor 280 may be electrically coupled to the transmitter 210 and the receiver 220 through conductive traces or bus connections. In this configuration, the processor 280 may receive the data RX Data from the receiver 220 and perform logic computations or execute various applications according to states of the received data RX Data. The processor 280 may also generate the data TX Data, and provide the data TX Data to the transmitter 210.

Figure 3:
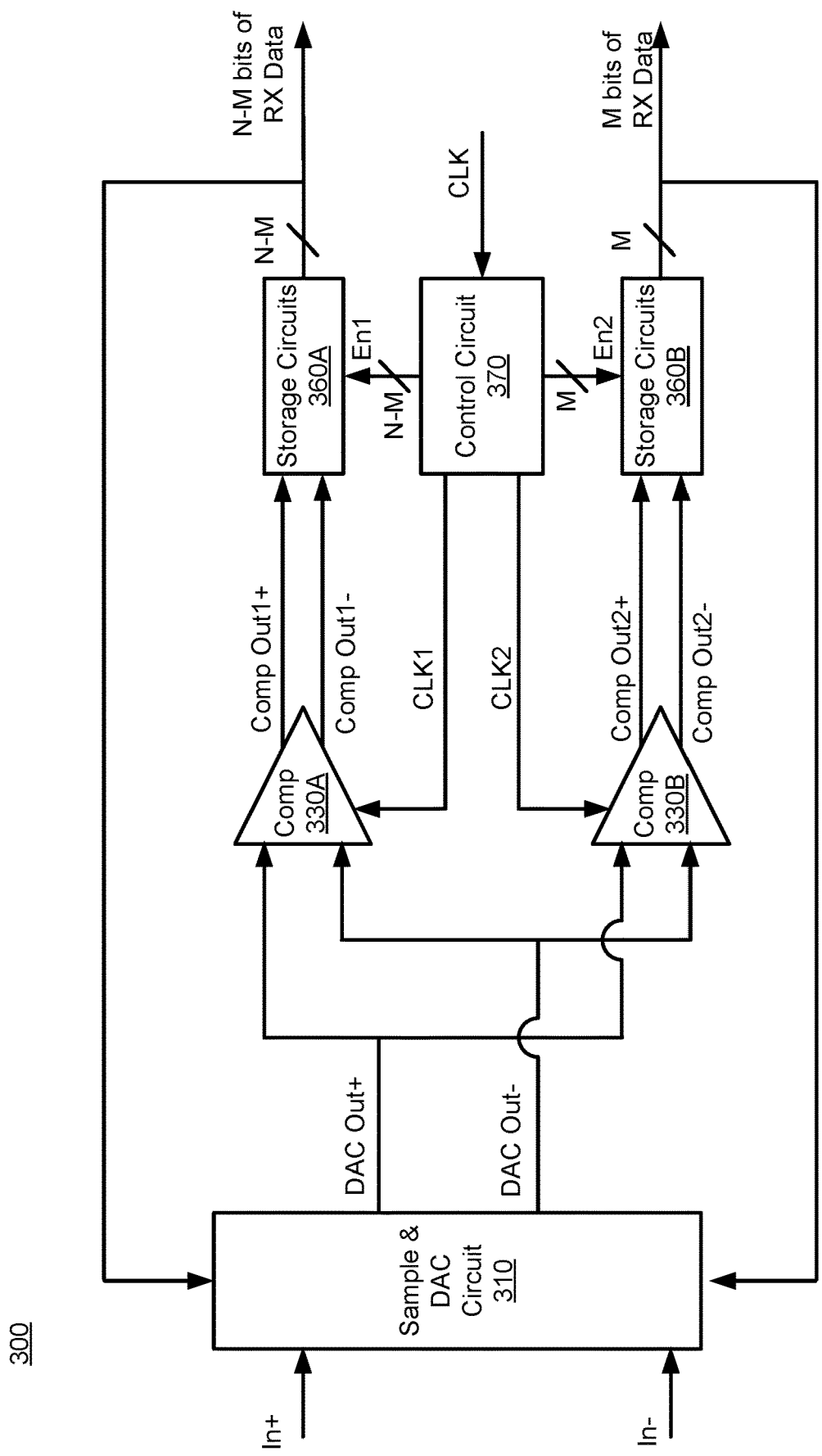
FIG. 3 is a schematic diagram of a SAR ADC, according to one or more embodiments.

FIG. 3 is a block diagram of a SAR ADC 300, according to one or more some embodiments. The SAR ADC 300 may be implemented as the SAR ADC 225 of FIG. 2. In some embodiments, the SAR ADC 300 includes a sample and DAC circuit 310, comparators 330A, 330B, a first set of storage circuits 360A, a second set of storage circuits 360B, and a control circuit 370. These components may operate together to receive input signals In+, In− and perform successive approximation analog to digital conversion to generate N-bit data RX Data corresponding to voltages of the input signals In+, In−. In some embodiments, the SAR ADC 300 includes more, fewer or different components than shown in FIG. 3. Although in FIG. 3, the sample and DAC circuit 310, the comparators 330A, 330B, and the storage circuits 360A, 360B are shown as generating and processing differential signals, some or all of these components may generate and process single ended signals.

In some embodiments, the sample and DAC circuit 310 is a circuit or a component that samples the input signals In+, In−, and generates DAC output signals DAC Out+, DAC Out−. In one implementation, the sample and DAC circuit 310 is embodied as a capacitive DAC circuit. In some embodiments, the sample and DAC circuit 310 includes input ports to receive the input signals In+, In−, feedback ports to receive N-bit data RX Data, and output ports to output DAC output signals DAC Out+, DAC Out−. In one configuration, N-M number of feedback ports of the sample and DAC circuit 310 are coupled to N-M number of output ports of the first set of storage circuits 360A, and M number of feedback ports of the sample and DAC circuit 310 are coupled to M number of output ports of the second set of storage circuits 360B. In one example, N may be 9 and M may be 4. In one configuration, a first output port of the sample and DAC circuit 310 is coupled to a first input port of the comparator 330A and a first input port of the comparator 330B. In one configuration, a second output port of the sample and DAC circuit 310 is coupled to a second input port of the comparator 330A and a second input port of the comparator 330B. In this configuration, the sample and DAC circuit 310 receives the input signals In+, In− at the input ports and N-bit data RX Data at the feedback ports, and samples the input signals In+, In−. The sample and DAC circuit 310 may perform DAC, according to the N-bit data RX Data to generate DAC output signals DAC Out+, DAC Out− at the output ports. The sample and DAC circuit 310 may provide the DAC output signals DAC Out+, DAC Out− to the comparators 330A, 330B. In one approach, for a bit $X^{th}$ of the N-bit data RX Data, the DAC output signals DAC Out+, DAC Out− indicate voltages (e.g., Vin+, Vin−) of the input signals In+, In− with voltages corresponding to N-X number of MSB(s) of Data RX. In one approach, the sample and DAC circuit 310 generates the DAC output signals DAC Out+, DAC Out−, according to the following equation:

$$V_{DACOut+} - V_{DACOut-} =$$

$$-(V_{in+} - V_{in-}) + \sum_{k=X}^{N} 2^{k-N-1} \times Vref \times (2 * RX\ \text{Data}(k) - 1).$$

In some embodiments, the comparator 330A is a circuit or a component that receives the DAC output signals DAC Out+, DAC Out−, and determines a state of a corresponding bit of the data RX Data according to the DAC output signals DAC Out+, DAC Out−. In one configuration, the comparator 330A includes a first input port coupled to the first output port of the sample and DAC circuit 310 to receive the DAC output signal DAC Out+, a second input port coupled to the second output port of the sample and DAC circuit 310 to receive the DAC output signal DAC Out−, a first output port coupled to first input ports of the first set of storage circuits 360A, a second output port coupled to second input ports of the first set of storage circuits 360A, and a clock input port coupled to a first clock output port of the control circuit 370. The first output port of the comparator 330A may be directly coupled to the first input ports of the storage circuits 360A, and the second output port of the comparator 330A may be directly coupled to the second input ports of the storage circuits 360A. Similarly, the first output port of the comparator 330B may be directly coupled to the first input ports of the storage circuits 360B, and the second output port of the comparator 330B may be directly coupled to the second input ports of the storage circuits 360B. In this configuration, the comparator 330A may be enabled or disabled according to the clock signal CLK1 from the control circuit 370. For example, the comparator 330A is enabled, in response to a rising edge or logic state '1' of the clock signal CLK1. For example, the comparator 330A is disabled, in response to a falling edge or logic state '0' of the clock signal CLK1. When the comparator 330A is enabled, the comparator 330A may determine a state of a bit according to the DAC output signals DAC Out+, DAC Out−, and generate comparator outputs Comp Out1+, Comp Out1− at the output ports indicating the determined state of the bit. For example, when the comparator 330A is enabled, in response to a difference in voltages of the DAC output signal DAC Out+, DAC Out− being higher than 0V or a reference voltage the comparator 330A may generate the comparator output Comp Out1+ having a logic state '1' and the comparator output Comp Out1− having a logic state '0'. For example, when the comparator 330A is enabled, in response to a difference in voltages of the DAC output signals DAC Out+, DAC Out− being lower than 0V or the reference voltage, the comparator 330A may generate the comparator output Comp Out1+ having a logic state '0' and the comparator output Comp Out1− having a logic state '1'. When the comparator 330A is disabled, the comparator 330A may reset the comparator outputs Comp Out1+, Comp Out1− to logic state '0'. The comparator 330A may provide the comparator outputs Comp Out1+, Comp Out1− to the first set of storage circuits 360A. The comparator outputs Comp Out1+, Comp Out1− may be differential signals.

In some embodiments, the comparator 330B is a circuit or a component that receives the DAC output signals DAC Out+, DAC Out−, and determines corresponding bits of the data RX Data according to the DAC output signals DAC Out+, DAC Out−. In some embodiments, the comparator 330A has a higher detection speed and/or is more power efficient than the comparator 330B, where the comparator 330B has a higher sensitivity than the comparator 330A. In one configuration, the comparator 330B includes a first input port coupled to the first output port of the sample and DAC circuit 310 to receive the DAC output signal DAC Out+, a second input port coupled to the second output port of the sample and DAC circuit 310 to receive the DAC output signal DAC Out−, a first output port coupled to first input ports of the second set of storage circuits 360B, a second output port coupled to second input ports of the second set of storage circuits 360B, and a clock input port coupled to a second clock output port of the control circuit 370. The operation of the comparator 330B is similar to the operation of the comparator 330A, except that the comparator 330B is enabled or disabled in response to the clock signal CLK2 instead of the clock signal CLK1, and the comparator 330B provides the comparator outputs Comp Out2+, Comp Out2− to the second set of storage circuits 360B instead of the first set of storage circuits 360A. Thus, detailed description of duplicated portion is omitted herein for the sake of brevity.

In some embodiments, the first set of storage circuits 360A is a set of components that stores N-M bits (e.g., MSBs) of data. In one implementation, the first set of storage circuits 360A is embodied as N-M number of flip flops or latches. In some embodiments, a first input port of each storage circuit 360A is coupled to the first output port of the comparator 330A, and a second input port of each storage circuit 360A is coupled to the second output port of the comparator 330A. In some embodiments, an enable port of each storage circuit 360A is coupled to a corresponding enable output port of the control circuit 370, and an output port of each storage circuit 360A is coupled to a corresponding feedback port of the sample and DAC circuit 310. In this configuration, each storage circuit 360A may be enabled or disabled according to a corresponding bit of N-M bit enable signal En1. For example, a first storage circuit 360A is enabled, in response to the enable signal EN1 having [00001]; a second storage circuit 360A is enabled, in response to the enable signal EN1 having [00010]; a third storage circuit 360A is enabled, in response to the enable signal EN1 having [00100]; a fourth storage circuit 360A is enabled, in response to the enable signal EN1 having [01000]; and a fifth storage circuit 360A is enabled, in response to the enable signal EN1 having [10000]. For example, all of the first set of storage circuits 360A are disabled, in response to the enable signal EN1 having [00000]. When a storage circuit 360A is enabled, the storage circuit 360A may update a corresponding bit of data RX Data, according to the comparator outputs Comp Out1+, Comp Out1−. For example, if a storage circuit 360A is enabled, in response to the comparator output Comp Out1+ having a logic state '1' and the comparator output Comp Out1− having a logic state '0', the storage circuit 360A may update a corresponding bit of the data RX Data to '1'. For example, if a storage circuit 360A is enabled, in response to the comparator output Comp Out1− having a logic state '1' and the comparator output Comp Out1+ having a logic state '0', the storage circuit 360A may update a corresponding bit of the data RX Data to '0'. If a storage circuit 360A is disabled, the storage circuit 360A may hold or maintain a corresponding bit of the data RX Data, irrespective of the comparator outputs Comp Out1+, Comp Out1− at the input ports.

In some embodiments, the second set of storage circuits 360B is a set of components that stores M bits (e.g., LSBs) of data. In one implementation, the second set of storage circuits 360B is embodied as M number of flip flops or latches. In some embodiments, a first input port of each storage circuit 360B is coupled to the first output port of the comparator 330B, and a second input port of each storage circuit 360B is coupled to the second output port of the comparator 330B. In some embodiments, an enable port of each storage circuit 360B is coupled to a corresponding enable output port of the control circuit 370, and an output port of each storage circuit 360B is coupled to a corresponding feedback port of the sample and DAC circuit 310. The operation of the storage circuits 360B is similar to the operation of the first set of storage circuits 360A, except that each of the storage circuits 360B is enabled or disabled in response to a corresponding state of the M bit enable signal En2 instead of the N-M bit enable signal En1, and each of the storage circuits 360B stores and outputs a corresponding bit of M bits (e.g., LSBs) of data RX Data instead of N-M bits (e.g., MSBs) of data RX Data. Thus, detailed description of duplicated portion is omitted herein for the sake of brevity.

In some embodiments, the control circuit 370 is a component that configures the comparators 330A, 330B and the storage circuits 360A, 360B to perform successive approximation analog to digital conversion. In one implementation, the control circuit 370 is implemented as a state machine or digital logic circuits. In some embodiments, the control circuit 370 includes an input port to receive a clock signal CLK, for example, from a clock generator (not shown), the first clock output port coupled to the clock input port of the comparator 330A, the second clock output port coupled to the clock input port of the comparator 330B, N-M number of enable output ports coupled to enable ports of the first set of storage circuits 360A and M number of enable output ports coupled to enable ports of the second set of storage circuits 360B. In this configuration, the control circuit 370 may generate the clock signal CLK1 at the first clock output port according to the clock signal CLK, and provide the clock signal CLK1 to the first comparator 330A. In addition, the control circuit 370 may generate the clock signal CLK2 at the second clock output port according to the clock signal CLK, and provide the clock signal CLK2 to the second comparator 330B. Moreover, the control circuit 370 may generate the N-M bit enable signal En1 at the N-M number of enable output ports according to the clock signal CLK, and provide the N-M bit enable signal En1 to the first set of storage circuits 360A. Furthermore, the control circuit 370 may generate the M bit enable signal En2 at the M number of enable output ports according to the clock signal CLK, and provide the M bit enable signal En2 to the second set of storage circuits 360B. In some embodiments, one or more of the signals CLK1, CLK2, En1, En2 are generated irrespective of the clock signal CLK, but may be generated according to the comparator outputs Comp Out1+, Comp Out1– and/or the comparator outputs Comp Out1+, Comp Out1–. For example, the signals CLK1, CLK2, En1, En2 may be generated in response to a rising edge of the comparator output Comp Out1+, Comp Out1–, Comp Out2+, Comp Out2–.

In one aspect, the control circuit 370 generates the clock signals CLK1, CLK2, and enable signals En1, En2 to configure the sample and DAC circuit 310, the comparators 330A, 330B, and the storage circuits 360A, 360B to perform successive approximation analog to digital conversion. In one approach, the control circuit 370 may generate the clock signal CLK1 having a train of pulses to select or enable the comparator 330A during a corresponding time period to determine states of N-M bits (e.g., MSBs) of data RX Data, while generating the clock signal CLK2 having a logic state '0' to disable the comparator 330B. When the comparator 330A is enabled, the control circuit 370 may generate the N-M bit enable signal En1 to configure the storage circuits 360A to store the determined states of the N-M bits (e.g., MSBs) of the data RX Data. For example, for the MSB of the data RX Data, the sample and DAC circuit 310 can sample the input signals In+, In– to generate the DAC output signals DAC Out+, DAC Out–. In response to a rising edge or a logic state '1' of the clock signal CLK1, the comparator 330A can generate comparator outputs Comp Out1+, Comp Out1– indicating a state of the MSB, according to the DAC output signals DAC Out+, DAC Out–. Then, in response to a pulse or a logic state '1' of a corresponding bit of the enable signal En1, a corresponding storage circuit 360A may store the state of the MSB of the data RX Data, according to the comparator outputs Comp Out1+, Comp Out1–. For the subsequent bit of the data RX Data, the sample and DAC circuit 310 can sample the input signals In+, In–, according to the state(s) of previous bit(s) of the data RX Data to generate the DAC output signals DAC Out+, DAC Out–. In response to a rising edge or a logic state '1' of the clock signal CLK1, the comparator 330A can generate comparator outputs Comp Out1+, Comp Out1– indicating a state of the subsequent bit, according to the DAC output signals DAC Out+, DAC Out–, according to the DAC output signals DAC Out+, DAC Out–. Then, in response to a pulse or a logic state '1' of a corresponding bit of the enable signal En1, a corresponding storage circuit 360A may store the state of the subsequent bit of the data RX Data, according to the comparator outputs Comp Out1+, Comp Out1–. The process may repeat for remaining bits of N-M bits of data RX Data.

After determining states of N-M bits of data RX Data, the control circuit 370 may generate the clock signal CLK2 having a train of pulses to selecting or enable the comparator 330B during a corresponding time period to determine states of M bits (e.g., LSBs) of data RX Data, while generating the clock signal CLK1 having a logic state '0' to disable the comparator 330A. When the comparator 330B is enabled, the control circuit 370 may generate the M bit enable signal En2 to configure the storage circuits 360B to store the determined states of the M bits (e.g., LSBs) of the data RX Data. For example, for the $M^{th}$ bit of the data RX Data, the sample and DAC circuit 310 can sample the input signals In+, In– according to states of previous N-M bits of the data RX Data to generate the DAC output signals DAC Out+, DAC Out–, and the comparator 330B can generate comparator outputs Comp Out2+, Comp Out2– indicating a state of the $M^{th}$ bit, according to the DAC output signals DAC Out+, DAC Out–. Then, a corresponding storage circuit 360B may store the state of the $M^{th}$ bit of the data RX Data. For the subsequent bit of the data RX Data, the sample and DAC circuit 310 can sample the input signals In+, In–, according to the states of previous bits of the data RX Data to generate the DAC output signals DAC Out+, DAC Out–. In response to a rising edge or a logic state '1' of the clock signal CLK2, the comparator 330B can generate comparator outputs Comp Out2+, Comp Out2– indicating a state of the subsequent bit, according to the DAC output signals DAC Out+, DAC Out–. Then, in response to a pulse or a logic state '1' of a corresponding bit of the enable signal En2, a corresponding storage circuit 360B may store the state of the subsequent bit of the data RX Data, according to the comparator outputs Comp Out2+, Comp Out2–. The process may repeat for remaining bits of M bits of data RX Data.

Advantageously, the SAR ADC 300 can achieve a speed and power efficiency. In one aspect, the comparator 330A has a higher detection speed and/or is more power efficient than the comparator 330B, where the comparator 330B has a higher sensitivity than the comparator 330A. Hence, the comparator 330A may determine states of a first subset of bits (e.g., MSBs) of the data RX Data, where the comparator 330B may determine states of a second subset of bits (e.g., LSBs) of the data RX Data. In one implementation, a multiplexer may be added between output ports of the comparators 330A, 330B and input ports of the storage circuits 360A, 360B, and may electrically couple the comparator 330A or the comparator 330B to the storage circuits 360A, 360B. However, electrically coupling the comparator 330A or the comparator 330B to the storage circuits 360A, 360B may increase capacitive loads at the output ports of the comparators 330A, 330B. Such increased capacitive loads may degrade a speed and power efficiency. By implementing the comparator 330A having output ports directly coupled to input ports of the storage circuits 360A and the comparator 330B having output ports directly coupled to input ports of the storage circuits 360B, capacitive loads at the output ports of the comparators 330A, 330B can be reduced, thereby achieving a speed and power efficiency.

Figure 4:
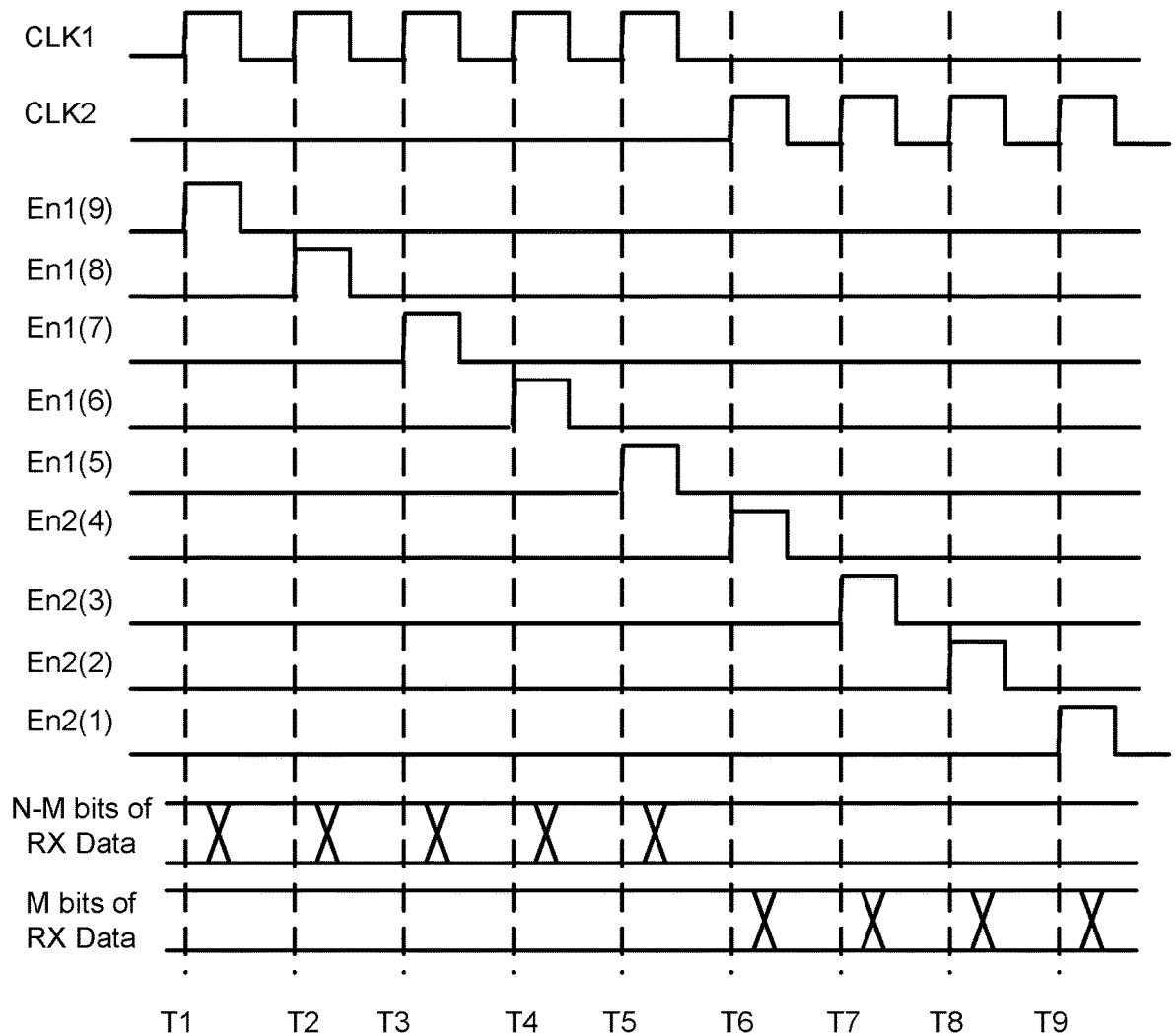
FIG. 4 is a timing diagram showing an operation of the SAR ADC of FIG. 3, according to one or more embodiments.

FIG. 4 is a timing diagram 400 showing an operation of the SAR ADC 300 of FIG. 3, according to one or more embodiments. In some embodiments, the control circuit 370 generates the clock signals CLK1, CLK2, and the enable signals En1, En2 to configure the sample and DAC circuit 310, the comparators 330A, 330B, and the storage circuits 360A, 360B to perform successive approximation analog to digital conversion to determine states of N-bit data RX Data. In the example shown in FIG. 4, N is 9 and M is 4. In some embodiments, the principles disclosed herein can be applied to perform successive approximation analog to digital conversion to determine states of a different number of bits of data RX Data. In one approach, the control circuit 370 may generate the clock signal CLK1 having pulses at times T1-T5, and generate the clock signal CLK2 having pulses at times T6-T9. In one aspect, the comparator 330A is enabled in response to the pulses of the clock signal CLK1 at times T1-T5, while the comparator 330B is disabled. In one aspect, the comparator 330B is enabled in response to the pulses of the clock signal CLK2 at times T6-T9, while the comparator 330A is disabled.

In one example, near or before time T1, the sample and DAC circuit 310 can sample the input signals In+, In− to generate the DAC output signals DAC Out+, DAC Out−. After the DAC output signals DAC Out+, DAC Out− settle at time T1, the comparator 330A can generate comparator outputs Comp Out1+, Comp Out1− indicating a state of the first bit (or MSB) of the data RX Data, according to the DAC output signals DAC Out+, DAC Out−. Then, a corresponding storage circuit 360A may store the state of the first bit or MSB of the data RX Data, in response to a logic state '1' of the enable signal En1(9).

In one example, after time T1 and near or before time T2, the sample and DAC circuit 310 can perform DAC according to the state of the first bit of the data RX Data to generate the DAC output signals DAC Out+, DAC Out−. After the DAC output signals DAC Out+, DAC Out− settle at time T2, the comparator 330A can generate comparator outputs Comp Out1+, Comp Out1− indicating a state of the subsequent bit (or the second bit), according to the DAC output signals DAC Out+, DAC Out−. Then, a corresponding storage circuit 360A may store the state of the subsequent bit (or the second bit) of the data RX Data, in response to a logic state '1' of the enable signal En1(8).

In one example, after time T2 and near or before time T3, the sample and DAC circuit 310 can perform DAC, according to the determined states of two bits of the data RX Data to generate the DAC output signals DAC+, DAC−. After the DAC output signals DAC+, DAC− settle at time T3, the comparator 330A can generate comparator outputs Comp Out1+, Comp Out1− indicating a state of the subsequent bit (or the third bit), according to the DAC output signals DAC+, DAC−. Then, a corresponding storage circuit 360A may store the state of the subsequent bit (or the third bit) of the data RX Data, in response to a logic state '1' of the enable signal En1(7).

In one example, after time T3 and near or before time T4, the sample and DAC circuit 310 can perform DAC, according to the determined states of three bits of the data RX Data to generate the DAC output signals DAC+, DAC−. After the DAC output signals DAC+, DAC− settle at time T4, the comparator 330A can generate comparator outputs Comp Out1+, Comp Out1− indicating a state of the subsequent bit (or the fourth bit), according to the DAC output signals DAC+, DAC−. Then, a corresponding storage circuit 360A may store the state of the subsequent bit (or the fourth bit) of the data RX Data, in response to a logic state '1' of the enable signal En1 (6).

In one example, after time T4 and near or before time T5, the sample and DAC circuit 310 can perform DAC, according to the determined states of four bits of the data RX Data to generate the DAC output signals DAC+, DAC−. After the DAC output signals DAC+, DAC− settle at time T5, the comparator 330A can generate comparator outputs Comp Out1+, Comp Out1− indicating a state of the subsequent bit (or the fifth bit), according to the DAC output signals DAC+, DAC−. Then, a corresponding storage circuit 360A may store the state of the subsequent bit (or the fifth bit) of the data RX Data, in response to a logic state '1' of the enable signal En1(5).

In one example, after time T5 and near or before time T6, the sample and DAC circuit 310 can perform DAC, according to the determined states of five bits of the data RX Data to generate the DAC output signals DAC+, DAC−. After the DAC output signals DAC+, DAC− settle at time T6, the comparator 330B can generate comparator outputs Comp Out2+, Comp Out2− indicating a state of the subsequent bit (or the sixth bit), according to the DAC output signals DAC+, DAC−. Then, a corresponding storage circuit 360B may store the state of the subsequent bit (or the sixth bit) of the data RX Data, in response to a logic state '1' of the enable signal En2(4).

In one example, after time T6 and near or before time T7, the sample and DAC circuit 310 can perform DAC, according to the determined states of six bits of the data RX Data to generate the DAC output signals DAC+, DAC−. After the DAC output signals DAC+, DAC− settle at time T7, the comparator 330B can generate comparator outputs Comp Out2+, Comp Out2− indicating a state of the subsequent bit (or the seventh bit), according to the DAC output signals DAC+, DAC−. Then, a corresponding storage circuit 360B may store the state of the subsequent bit (or the seventh bit) of the data RX Data, in response to a logic state '1' of the enable signal En2(3).

In one example, after time T7 and near or before time T8, the sample and DAC circuit 310 can perform DAC, according to the determined states of seven bits of the data RX Data to generate the DAC output signals DAC+, DAC−. After the DAC output signals DAC+, DAC− settle at time T8, the comparator 330B can generate comparator outputs Comp Out2+, Comp Out2− indicating a state of the subsequent bit (or the eighth bit), according to the DAC output signals DAC+, DAC−. Then, a corresponding storage circuit 360B may store the state of the subsequent bit (or the eighth bit) of the data RX Data, in response to a logic state '1' of the enable signal En2(2).

In one example, after time T8 and near or before time T9, the sample and DAC circuit 310 can perform DAC, according to the states of eight bits of the data RX Data to generate the DAC output signals DAC+, DAC−. After the DAC output signals DAC+, DAC− settle at time T9, the comparator 330B can generate comparator outputs Comp Out2+, Comp Out2− indicating a state of the subsequent bit (or the ninth bit), according to the DAC output signals DAC+, DAC−. Then, a corresponding storage circuit 360B may store the state of the subsequent bit (or the ninth bit) of the data RX Data, in response to a logic state '1' of the enable signal En2(1).

Figure 5:
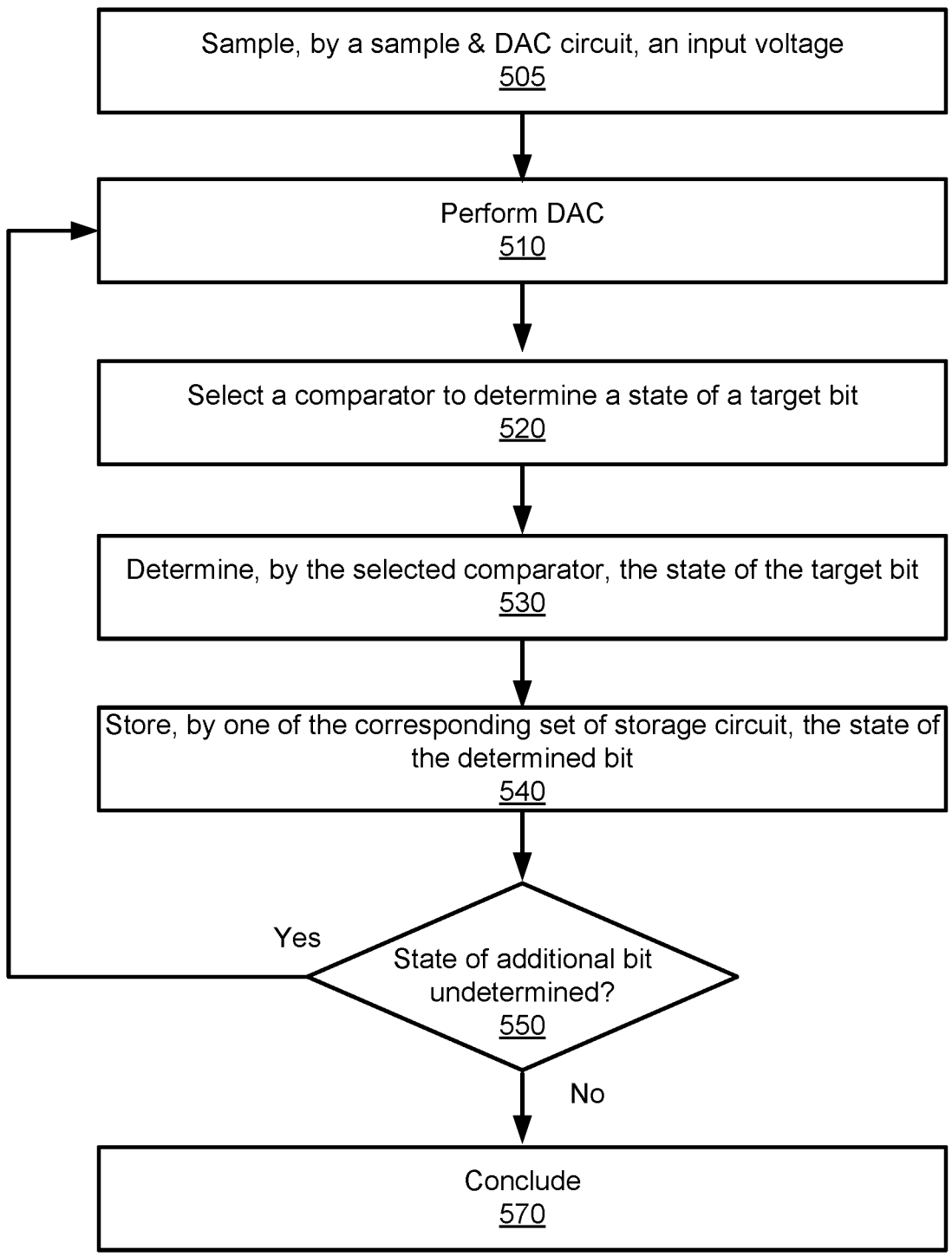
FIG. 5 is a flow chart depicting a process of determining a plurality of bits corresponding to an input voltage through a successive approximation, according to one or more embodiments.

FIG. 5 is a flow chart depicting a process 500 of determining a plurality of bits corresponding to an input voltage through a successive approximation, according to one or more embodiments. In some embodiments, the process 500 is performed by the device 200 (e.g., the SAR ADC 225 or the SAR ADC 300). In other embodiments, the process 500 is performed by other entities. In some embodiments, the process 500 includes more, fewer, or different steps than shown in FIG. 5.

In one approach, to determine a state of a target bit of the N-bit data RX Data, the device 200 samples 505, by a DAC circuit (e.g., sample and DAC circuit 310), an input voltage (e.g., voltages of input signals In+, In−). The device 200 performs 510, by the DAC circuit (e.g., sample and DAC circuit 310), DAC to generate DAC output signals DAC Out+, DAC Out−. Initially, the target bit may be the MSB of the N-bit data RX data. The DAC circuit may perform DAC, according to known or determined state(s) of one or more previous bits of the N-bit data RX data, as described above with respect to FIGS. 3 and 4.

In one approach, the device 200 selects 520 a comparator to determine a state of a target bit during a corresponding time period. For example, the control circuit 370 may generate clock signals CLK1, CLK2 to select one of the comparators 330A, 330B. In one aspect, the comparator 330A is coupled to a first set of storage circuits 360A and the comparator 330B is coupled to a second set of storage circuits 360B. The comparator 330A may have a higher detection speed and/or is more power efficient than the comparator 330B, where the comparator 330B may have a higher sensitivity than the comparator 330A. In one aspect, the control circuit 370 selects the comparator 330A, in response to the target bit being one of a first subset of predetermined bits (e.g., the N-M bits (e.g., MSBs)) of the N-bit data RX data. In one aspect, the control circuit 370 selects the comparator 330B, in response to the target bit being one of a second subset of predetermined bits (e.g., the M bits (e.g., LSBs)) of the N-bit data RX data.

In one approach, the device 200 determines 530, by the selected comparator, the state of the target bit, according to the sampled voltage. In one approach, the device 200 may store 540, by one of the corresponding set of storage circuits coupled to the selected comparator, the state of the determined bit. For example, the control circuit 370 may generate the enable signal En1 or the enable signal En2 to enable the one of the corresponding set of storage circuits to store the state of the determined bit.

In one approach, the device 200 determines 550 whether a state of an additional bit is undetermined. For example, the control circuit 370 may determine that a state of an additional bit of the data RX Data is undetermined, in response to the target bit not being the LSB of the N-bit data RX Data.

In response to determining that a state of an additional bit (or subsequent MSB) is undetermined, the device 200 may select the additional bit as a target bit, and proceed to step 510. For example, the control circuit 370 may determine that states of all N-bits of the data RX Data are determined, in response to the target bit being the LSB of the N-bit data RX Data. In response to determining that states of all bits of the N-bit data Rx Data are determined, the device 200 may conclude 570 the process 500.

Advantageously, the SAR ADC 300 can achieve a speed and power efficiency. As set forth above, the comparator 330A may have a higher detection speed and/or is more power efficient than the comparator 330B, where the comparator 330B may have a higher sensitivity than the comparator 330A. Hence, the comparator 330A may determine states of a first subset of bits (e.g., MSBs) of the data RX Data, where the comparator 330B may determine states of a second subset of bits (e.g., LSBs) of the data RX Data. By implementing the comparator 330A having output ports directly coupled to input ports of the storage circuits 360A and the comparator 330B having output ports directly coupled to input ports of the storage circuits 360B, capacitive loads at the output ports of the comparators 330A, 330B can be reduced, thereby achieving a speed and power efficiency.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a stand-alone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. A device including:
   a sample and digital to analog conversion (DAC) circuit to sample an input voltage to obtain a first sampled voltage;
   a first comparator coupled to the sample and DAC circuit;
   a first set of storage circuits coupled to the first comparator and the sample and DAC circuit, the first set of storage circuits to store a first subset of a plurality of bits corresponding to the input voltage;
a second comparator coupled to the sample and DAC circuit;
a second set of storage circuits coupled to the second comparator and the sample and DAC circuit, the second set of storage circuits to store a second subset of the plurality of bits corresponding to the input voltage; and
a control circuit coupled to the first comparator and the second comparator, the control circuit configured to select, during a first time period for a target bit from the first subset of the plurality of bits corresponding to the input voltage, the first comparator to determine a state of the target bit according to the first sampled voltage.

2. The device of claim 1, wherein the first comparator has a faster detection speed than the second comparator, wherein the second comparator has a higher sensitivity than the first comparator.

3. The device of claim 1, wherein the control circuit is configured to select, during a second time period for another target bit of the plurality of bits, the second comparator to determine a state of the another target bit.

4. The device of claim 1, wherein a corresponding one of the first set of storage circuits is configured to store the determined state of the target bit.

5. The device of claim 4, wherein the sample and DAC circuit is configured to:
receive, from the corresponding one of the first set of storage circuits, the determined state of the target bit, and
sample the input voltage to obtain a second sampled voltage, based at least in part on the determined state of the target bit from the corresponding one of the first set of storage circuits.

6. The device of claim 5, wherein the control circuit is configured to select, during a second time period for another target bit of the plurality of bits, the second comparator to determine a state of the another target bit, wherein the second comparator is configured to determine a state of the another target bit according to the second sampled voltage from the sample and DAC circuit.

7. The device of claim 6, wherein a corresponding one of the second set of storage circuits is configured to store the determined state of the another target bit.

8. The device of claim 1, wherein the control circuit is configured to select, for the target bit, the first comparator, in response to the target bit being one of the first subset of the plurality of bits.

9. The device of claim 1, wherein an output of the first comparator is directly coupled to input ports of the first set of storage circuits, wherein an output of the second comparator is directly coupled to input ports of the second set of storage circuits.

10. An apparatus comprising:
a receiver comprising:
a sample and digital to analog conversion (DAC) circuit to sample an input voltage,
a first comparator coupled to the sample and DAC circuit,
a first set of storage circuits coupled between the first comparator and the sample and DAC circuit,
a second comparator coupled to the sample and DAC circuit,
a second set of storage circuits coupled between the second comparator and the sample and DAC circuit, and
a control circuit configured to select, for each of a plurality of bits corresponding to the input voltage, a corresponding comparator from the first comparator and the second comparator to determine a state of the each of the plurality of bits during a corresponding time period; and
a processor coupled to the receiver, the processor configured to receive states of the plurality of bits from the first set of storage circuits and the second set of storage circuits and perform logic computations according to the received states of the plurality of bits.

11. The apparatus of claim 10, wherein the first comparator has a faster detection speed than the second comparator, wherein the second comparator has a higher sensitivity than the first comparator.

12. The apparatus of claim 10, wherein the control circuit is configured to select, for a first subset of the plurality of bits, the first comparator and select, for a second subset of the plurality of bits, the second comparator.

13. The apparatus of claim 10, wherein the sample and DAC circuit is configured to sample, for a first bit of the plurality of bits, the input voltage to obtain a first sampled voltage, wherein the first comparator is configured to determine a state of the first bit of the plurality of bits according to the first sampled voltage.

14. The apparatus of claim 13, wherein a corresponding one of the first set of storage circuits is configured to store the determined state of the first bit of the plurality of bits.

15. The apparatus of claim 14, wherein based at least in part on the determined state of the first bit of the plurality of bits from the corresponding one of the first set of storage circuits, the sample and DAC circuit is configured to sample, for a second bit of the plurality of bits, the input voltage to obtain a second sampled voltage, wherein the second comparator is configured to determine a state of the second bit of the plurality of bits according to the second sampled voltage.

16. The apparatus of claim 10, wherein an output of the first comparator is directly coupled to input ports of the first set of storage circuits, wherein an output of the second comparator is directly coupled to input ports of the second set of storage circuits.

17. A method comprising:
sampling, by a sample and digital to analog conversion (DAC) circuit, an input voltage to obtain a first sampled voltage;
determining, by a first comparator coupled to a first set of storage circuits, a state of a first bit of a plurality of bits corresponding to the input voltage, according to the first sampled voltage;
sampling, by the sample and DAC circuit, the input voltage to obtain a second sampled voltage; and
determining, by a second comparator coupled to a second set of storage circuits different from the first set of storage circuits, a state of a second bit of the plurality of bits, according to the second sampled voltage.

18. The method of claim 17, wherein the first comparator has a faster detection speed than the second comparator, wherein the second comparator has a higher sensitivity than the first comparator.

19. The method of claim 17, further comprising:
storing, by a corresponding one of the first set of storage circuits, the determined state of the first bit; and
storing, by a corresponding one of the second set of storage circuits, the determined state of the second bit.

20. The method of claim 19, wherein sampling, by the sample and DAC circuit, the input voltage to obtain the second sampled voltage is based at least in part on the determined state of the first bit stored by the corresponding one of the first set of storage circuits.

\* \* \* \* \*